United States Patent
Chua

(10) Patent No.: US 7,964,514 B2
(45) Date of Patent: Jun. 21, 2011

(54) MULTIPLE NITROGEN PLASMA TREATMENTS FOR THIN SION DIELECTRICS

(75) Inventor: Thai Cheng Chua, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 498 days.

(21) Appl. No.: 11/367,882

(22) Filed: Mar. 2, 2006

(65) Prior Publication Data

US 2007/0207624 A1  Sep. 6, 2007

(51) Int. Cl.
*H01L 21/31* (2006.01)
*H01L 21/469* (2006.01)

(52) U.S. Cl. ............... 438/769; 438/758; 257/E21.197; 257/E21.292; 257/E21.268; 257/E21.336

(58) Field of Classification Search .......... 438/758, 438/769; 257/E21.197, 268, 292, 336
See application file for complete search history.

(56) References Cited

U.S. PATENT DOCUMENTS

| | | | |
|---|---|---|---|
| 4,725,560 A | 2/1988 | Abernathey et al. | |
| 5,198,392 A * | 3/1993 | Fukuda et al. | 438/769 |
| 5,536,681 A * | 7/1996 | Jang et al. | 438/763 |
| 5,591,494 A | 1/1997 | Sato et al. | |
| 5,731,238 A * | 3/1998 | Cavins et al. | 438/261 |
| 5,780,115 A | 7/1998 | Park et al. | |
| 5,939,131 A | 8/1999 | Kim et al. | |
| 6,020,243 A | 2/2000 | Wallace et al. | |
| 6,041,734 A | 3/2000 | Raoux et al. | |
| 6,063,704 A | 5/2000 | Demirlioglu | |
| 6,077,737 A | 6/2000 | Yang et al. | |
| 6,136,654 A | 10/2000 | Kraft et al. | |
| 6,136,688 A * | 10/2000 | Lin et al. | 438/624 |
| 6,162,709 A | 12/2000 | Raoux et al. | |
| 6,268,267 B1 | 7/2001 | Lim | |
| 6,297,162 B1 * | 10/2001 | Jang et al. | 438/706 |
| 6,326,657 B1 * | 12/2001 | Ohkawa | 257/296 |
| 6,365,518 B1 | 4/2002 | Lee et al. | |
| 6,380,056 B1 * | 4/2002 | Shue et al. | 438/591 |
| 6,414,375 B1 * | 7/2002 | Ohkawa | 257/637 |

(Continued)

FOREIGN PATENT DOCUMENTS

EP  0 847 079  6/1998

(Continued)

OTHER PUBLICATIONS

PCT International Search Report and Written Opinion dated Nov. 23, 2007 for International Application No. PCT/US2007/61832.

(Continued)

*Primary Examiner* — Thao X Le
*Assistant Examiner* — Eric W Jones
(74) *Attorney, Agent, or Firm* — Patterson & Sheridan, L.L.P.

(57) ABSTRACT

A method for the deposition of a dielectric film including forming silicon nitride on the surface of the substrate, oxidizing the silicon nitride on the surface of the substrate, exposing the surface of the substrate to a hydrogen-free nitrogen source, and annealing the substrate. A method for the deposition of a dielectric film including forming silicon nitride on the surface of the substrate, oxidizing the silicon nitride on the surface of the substrate, including exposing the surface of the substrate to a gas selected from the group of oxygen, nitric oxide, and nitrous oxide, and exposing the surface of the substrate to a hydrogen-free nitrogen source, wherein the hydrogen-free nitrogen source is a gas selected from the group of nitrogen, nitric oxide, and nitrous oxide.

1 Claim, 3 Drawing Sheets

U.S. PATENT DOCUMENTS

| | | |
|---|---|---|
| 6,509,604 B1 | 1/2003 | Pham et al. |
| 6,548,366 B2 | 4/2003 | Niimi et al. |
| 6,548,368 B1 | 4/2003 | Narwankar et al. |
| 6,599,807 B2 | 7/2003 | Lim et al. |
| 6,605,511 B2 | 8/2003 | Pham et al. |
| 6,610,614 B2 | 8/2003 | Niimi et al. |
| 6,610,615 B1 | 8/2003 | McFadden et al. |
| 6,632,747 B2 | 10/2003 | Niimi et al. |
| 6,649,538 B1 | 11/2003 | Cheng et al. |
| 6,821,873 B2 | 11/2004 | Visokay et al. |
| 6,831,021 B2 | 12/2004 | Chua et al. |
| 6,835,630 B2 * | 12/2004 | Wu et al. .................. 438/381 |
| 2001/0003661 A1 * | 6/2001 | Smith ........................ 438/239 |
| 2001/0049186 A1 | 12/2001 | Ibok |
| 2002/0011619 A1 * | 1/2002 | Ohkawa ..................... 257/306 |
| 2002/0014700 A1 * | 2/2002 | Tokai et al. ................ 257/773 |
| 2002/0047202 A1 * | 4/2002 | Moore et al. ............... 257/751 |
| 2002/0072183 A1 * | 6/2002 | Iba et al. .................... 438/303 |
| 2002/0197880 A1 | 12/2002 | Niimi et al. |
| 2002/0197882 A1 | 12/2002 | Niimi et al. |
| 2002/0197883 A1 | 12/2002 | Niimi et al. |
| 2002/0197884 A1 | 12/2002 | Niimi et al. |
| 2003/0082884 A1 * | 5/2003 | Faltermeier et al. ....... 438/387 |
| 2003/0109146 A1 | 6/2003 | Colombo et al. |
| 2003/0111678 A1 | 6/2003 | Luigi et al. |
| 2003/0181012 A1 | 9/2003 | Wang et al. |
| 2003/0234417 A1 | 12/2003 | Raaijmakers et al. |
| 2003/0235968 A1 | 12/2003 | Oh et al. |
| 2004/0038486 A1 | 2/2004 | Chua et al. |
| 2004/0038487 A1 | 2/2004 | Olsen |
| 2004/0058490 A1 * | 3/2004 | Ishii ............................ 438/229 |
| 2004/0124441 A1 * | 7/2004 | Moore et al. ............... 257/200 |
| 2004/0137709 A1 * | 7/2004 | Zhang et al. ............... 438/618 |
| 2004/0159865 A1 * | 8/2004 | Allen et al. ................. 257/280 |
| 2004/0175961 A1 * | 9/2004 | Olsen ......................... 438/786 |
| 2004/0242021 A1 | 12/2004 | Kraus et al. |
| 2005/0014352 A1 * | 1/2005 | Torii et al. .................. 438/591 |
| 2005/0106896 A1 * | 5/2005 | Fukuchi ..................... 438/778 |
| 2005/0130448 A1 | 6/2005 | Olsen et al. |
| 2005/0142861 A1 * | 6/2005 | Yeom ......................... 438/639 |
| 2005/0255644 A1 * | 11/2005 | Ohkawa ..................... 438/197 |
| 2006/0094257 A1 * | 5/2006 | Hoffman et al. ........... 438/778 |
| 2006/0166446 A1 * | 7/2006 | Sasaki et al. ............... 438/287 |
| 2006/0246647 A1 * | 11/2006 | Visokay et al. ............ 438/199 |
| 2006/0255370 A1 * | 11/2006 | Yamazaki et al. ......... 257/223 |
| 2007/0010103 A1 * | 1/2007 | Chua et al. ................. 438/786 |
| 2007/0012661 A1 * | 1/2007 | Vasilyeva et al. .......... 216/67 |
| 2007/0040207 A1 * | 2/2007 | Nam et al. .................. 257/310 |
| 2008/0093711 A1 * | 4/2008 | Raaijmakers et al. ..... 257/638 |
| 2009/0221127 A1 * | 9/2009 | Iijima ......................... 438/396 |

FOREIGN PATENT DOCUMENTS

| | | |
|---|---|---|
| EP | 1 326 271 | 7/2003 |
| JP | 6-140392 | 5/1994 |
| WO | WO 02/23614 | 3/2002 |

OTHER PUBLICATIONS

Ishikawa, et al. "Nitride-Sandwiched-Oxide Gate Insulator For Low Power CMOS", 0-7803-7463-X.02; 2002, p. 869-872, IEEE.

Kraft, et al., "Surface Nitridation of Silicon Dioxide With a High Density Nitrogen Plasma," J. Vac. Sci. Technol. B 15(4), Jul./Aug. 1997, pp. 967-970.

Krug, et al., "Low Energy Nitrogen Implantation Into Si and $SiO_2$/Si," Nuclear Instruments and Methods in Physics Research b 175-177 (2001) pp. 694-698.

Mahapatra, et al., "Device Scaling Effects on Hot-Carrier Induced Interface and Oxide-Trapped Charge Distributions in MOSFET's." IEEE Transactions on Electron Devices, vol. 47, No. 4, Apr. 2000, pp. 789-796.

Matsushita, et al., "Novel Fabrication Process to Realize Ultra-Thin (EOT=0.7nm) and Ultra-Low Leakage SiON Gate Dielectrics." IEEE—2004 Symposium on VLSI Technology, Digest of Technical Papers.

Park, et al., "Transient Characteristics of Nitrogen Gas-Pulsed Electron Cyclotron Resonance Plasma," j. Vac. Sci. Technol. A 14(5), Sep./Oct. 1996 pp. 2814-2819.

Schroder, et al., "Negative Bias Temperature Instability: Road to Cross in Deep Submicron Silicon Semiconductor Manufacturing." Journal of Applied Physics, vol. 94, No. 1, Jul. 1, 2003 American Institute of Physics, pp. 1-18.

Tsujikawa, et al., "An Ultra-Thin Silicon Nitride Gate Dielectric with Oxygen-Enriched Interface (OI-SiN) for CMOS with EOT of 0.9 nm and Beyond." IEEE—2002 Symposium on VLSI Technology, Digest of Technical Papers.

Wang, et al., "A Novel Process to Downscale SiON Gate Dielectrics (EOT=1.06 nm, Jgn=8.5 A/cm2) Toward Sub-65nm and Beyond." 2005 Symposium on VLSI Technology, Digest of Technical Papers.

PCT International Search Report and Written Opinion for PCT/US2004/037346, dated Jun. 29, 2005.

PCT International Search Report and Written Opinion, dated Oct. 7, 2004.

PCT Notification Concerning Transmittal of International Preliminary Report on Patentability and Written Opinion dated Dec. 15, 2005 for International Application No. PCT/US04/016326).

U.S. Appl. No. 11/178,749, filed Jul. 11, 2005.

* cited by examiner

MULTIPLE NITROGEN PLASMA TREATMENTS FOR THIN SION DIELECTRICS

BACKGROUND OF THE INVENTION

1. Field of the Invention

Embodiments of the present invention generally relate to a method of forming a dielectric. More particularly, embodiments of the invention relate to a method of forming a silicon oxynitride ($SiO_xN_y$) dielectric.

2. Description of the Related Art

As integrated circuit sizes and the sizes of the transistors thereon decrease, the drive current required to increase the speed of the transistor has increased. The drive current increases as the capacitance increases, and capacitance=kA/d, wherein k is the dielectric constant, d is the dielectric thickness, and A is the area of the device. Decreasing the dielectric thickness and increasing the dielectric constant of the gate dielectric are methods of increasing the gate capacitance and the drive current.

Attempts have been made to reduce the thickness of dielectrics, such as silicon dioxide ($SiO_2$) dielectrics, below 20 Å. However, the use of $SiO_2$ dielectrics with thicknesses below 20 Å often results in undesirable performance and durability. For example, boron from a boron doped electrode can penetrate through a thin $SiO_2$ dielectric into the underlying silicon substrate. Also, there is typically an increase in gate leakage current, i.e., tunneling current, with thin dielectrics that increases the amount of power consumed by the gate. Thin $SiO_2$ gate dielectrics may be susceptible to negative-channel metal-oxide semiconductor (NMOS) hot carrier degradation, in which high energy carriers traveling across the dielectric can damage or destroy the channel. Thin $SiO_2$ gate dielectrics may also be susceptible to positive channel metal oxide semiconductor (PMOS) negative bias temperature instability (NBTI), wherein the threshold voltage or drive current drifts with operation of the gate.

A method of forming a dielectric layer suitable for use as the gate dielectric layer in a MOSFET (metal oxide semiconductor field effect transistor) includes nitriding a thin silicon oxide film in a nitrogen-containing plasma. Increasing the net nitrogen content in the gate oxide to increase the dielectric constant is desirable for several reasons. For example, the bulk of the oxide dielectric may be lightly incorporated with nitrogen during the plasma nitridation process, which reduces the equivalent oxide thickness (EOT) over the starting oxide. This may result in a gate leakage reduction, due to tunneling during the operation of a field effect transistor, at the same EOT as the oxide dielectric that is not nitrided. At the same time, increased nitrogen content may also reduce damage induced by Fowler-Nordheim (F-N) tunneling currents during additional processing operations, provided that the thickness of the dielectric is in the F-N range. Another benefit of increasing the net nitrogen content of the gate oxide is that the nitrided gate dielectric is more resistant to the problem of gate etch undercut, which in turn reduces defect states and current leakage at the gate edge.

In U.S. Pat. No. 6,610,615, titled "Plasma Nitridation for Reduced Leakage Gate Dielectric Layers" and issued on Aug. 26, 2003, McFadden, et al. compares nitrogen profiles in a silicon oxide film for both thermal and plasma nitridation process. The nitrided oxide films are disposed on a silicon substrate. Testing of the thermal nitrided oxide films nitrogen profiles in the crystalline silicon beneath the oxide film shows a first concentration of nitrogen at a top surface of an oxide layer, a generally declining concentration of nitrogen deeper in the oxide, an interfacial accumulation of nitrogen at the oxide-silicon interface, and finally, a nitrogen concentration gradient that is generally declining with distance into the substrate. In contrast, it can be shown that the plasma nitridation process produces a nitrogen profile that is essentially monotonically decreasing from the top surface of the oxide layer through the oxide-silicon interface and into the substrate. The undesirable interfacial accumulation of nitrogen observed with a thermal nitridation process does not occur with the ionic bombardment of the nitrogen plasma. Furthermore, the nitrogen concentration in the substrate is lower, at all depths, than is achieved with the thermal nitridation process.

A benefit of increasing nitrogen concentration at the gate electrode-gate oxide interface is that dopant diffusion with dopants, such as boron, from polysilicon gate electrodes into or through the gate oxide is reduced. This improves device reliability by reducing defects in the bulk of the gate oxide caused by, for example, in-diffused boron from a boron doped polysilicon gate electrode. Another benefit of reducing nitrogen content at the gate oxide-silicon channel interface is the reduction of fixed charge and interface state density. This improves channel mobility and transconductance.

A nitrogen containing silicon oxide dielectric material that can be used with a physical thickness that is effective to reduce current leakage density and provide high gate capacitance is needed. The nitrogen containing silicon oxide dielectric material must have a dielectric constant that is higher than that of silicon dioxide. Typically, the thickness of such a dielectric material layer is expressed in terms of the equivalent oxide thickness (EOT). Thus, the EOT of a dielectric layer is the thickness that the dielectric layer would have if its dielectric constant were that of silicon dioxide.

A $SiO_xN_y$ dielectric can be formed by incorporating nitrogen into a $SiO_2$ layer or forming a silicon nitride layer on a silicon substrate and incorporating oxygen into the layer by an oxidation process involving oxygen or precursor gases that contain nitrogen and oxygen.

However, as device geometries continue to shrink, there remains a need for an improved method of depositing silicon oxynitride dielectrics that have lower EOT than conventionally deposited silicon oxynitride films.

SUMMARY OF THE INVENTION

The present invention generally provides a method for the deposition of a dielectric film comprising forming silicon nitride on the surface of the substrate, oxidizing the silicon nitride on the surface of the substrate, exposing the surface of the substrate to a hydrogen-free nitrogen source, and annealing the substrate.

The present invention also generally provides a method for the deposition of a dielectric film comprising forming silicon nitride on the surface of the substrate, oxidizing the silicon nitride on the surface of the substrate, including exposing the surface of the substrate to a gas selected from the group of oxygen, nitric oxide, and nitrous oxide, and exposing the surface of the substrate to a hydrogen-free nitrogen source, wherein the hydrogen-free nitrogen source is a gas selected from the group of nitrogen, nitric oxide, and nitrous oxide.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention provides a method of forming a silicon oxynitride film with lower hydrogen content than those films formed using a plasma nitridation process that provides plasma with ammonia or other hydrogen containing precursors. The resulting silicon oxynitride films with low hydrogen content have a higher dielectric constant and thinner equivalent oxide thickness than silicon oxynitride films with higher hydrogen content. Preferably, the silicon oxynitride films have a hydrogen content of 5 percent or less.

Figure 1:
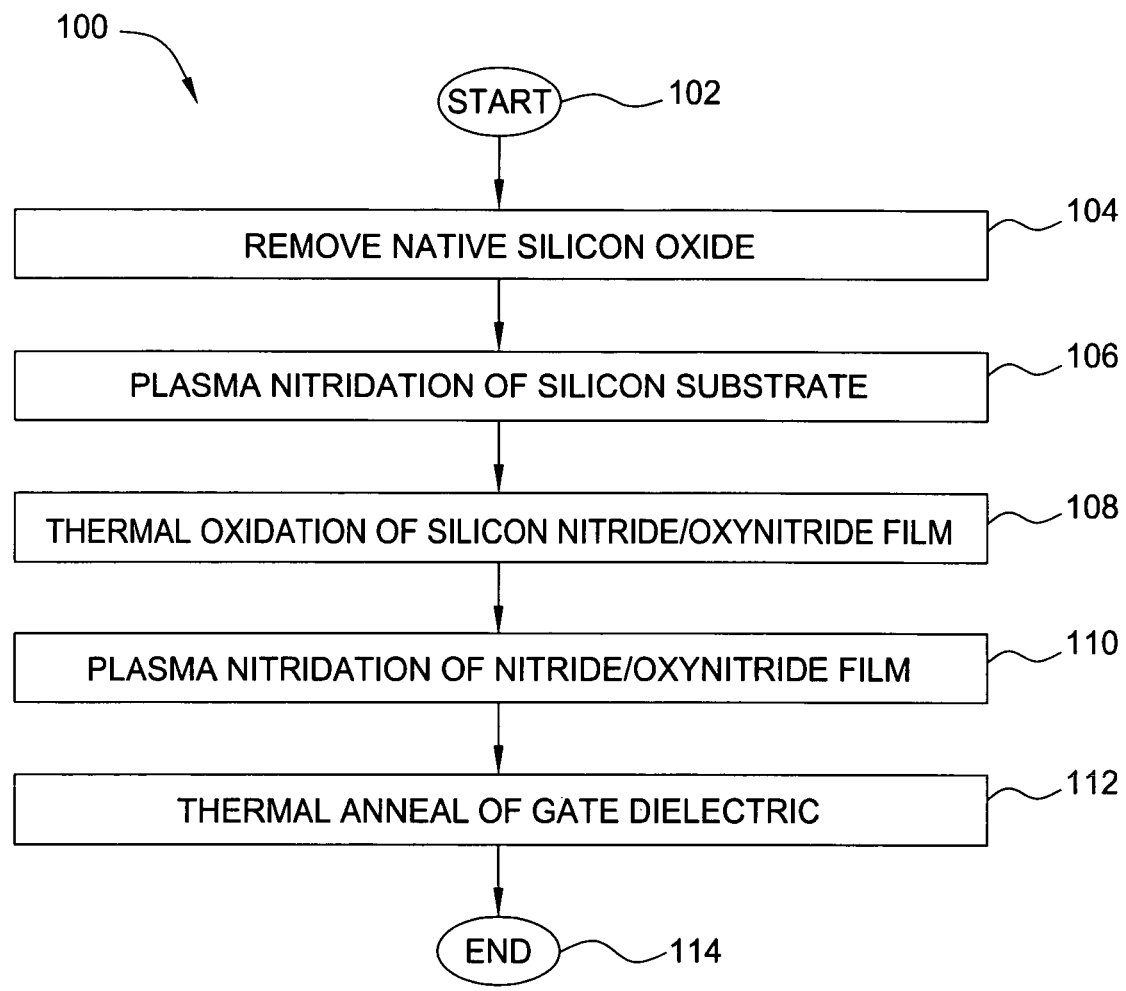
FIG. 1 is a flow chart depicting a process flow of one embodiment of the invention.

FIG. 1 is a flow diagram illustrating one embodiment of a process 100. Films formed using processes described herein may be used, for example, in a device such as field effect transistors, for example, complementary metal oxide semiconductor structures (CMOS) field effect transistors. Process 100 begins by introducing a substrate into a process chamber that is part of an integrated tool containing multiple process chambers connected by a common, shared chamber during start step 102. Next, during native oxide removal step 104, the substrate is moved to a cleaning process chamber to remove native silicon oxides that form across the substrate surface during substrate transport and storage. After the native silicon oxide is removed from the substrate surface, the substrate is moved to a chamber for exposure to a nitrogen containing plasma to form silicon oxynitride during plasma nitration step 106. Then, the substrate is exposed to an oxygen containing precursor and annealed during thermal oxidation step 108. Next, the substrate is again exposed to a plasma formed with a nitrogen containing, hydrogen free precursor during plasma nitridation step 110. The substrate is annealed during thermal anneal step 112, and then forwarded on to additional processing steps during end step 114.

FIGS. 2A-2D are sectional views of a substrate illustrating the process and resulting changes in film composition as the steps of process 100 are performed. Initially, a substrate 200 is positioned in a processing chamber during the start step 102. One example of a processing chamber that can be used to perform processes described herein is a decoupled plasma nitridation process chamber described in U.S. Patent Application Publication No. 2004/0242021, entitled "Method and Apparatus for Plasma Nitridation of Gate Dielectrics Using Amplitude Modulated Radio Frequency Energy," assigned to Applied Materials, Inc., published Dec. 2, 2004, and which is hereby incorporated by reference herein. One suitable decoupled plasma nitridation (DPN) chamber is the DPN CENTURA™ chamber, which is commercially available from Applied Materials, Inc. of Santa Clara, Calif. An example of an integrated processing system that may be used is the GATE STACK CENTURA™ system, available from Applied Materials, Inc. of Santa Clara, Calif. The process may be performed on any substrate, such as a 200 mm or 300 mm substrate or other medium suitable for semiconductor or flat panel display processing.

A native oxide layer 204 is often present on the surface of the substrate 200. The layer 204 may be removed using a wet clean method. During native silicon oxide removal step 104, the layer 204 is removed using a hydrofluoric acid solution including hydrogen fluoride (HF) and deionized (DI) water. The solution has a concentration of about 0.1 to about 10.0 weight percent HF and a temperature of about 20° C. to about 30° C. In a preferred embodiment, the solution has about 0.5 weight percent of HF and a temperature of about 25° C. A brief exposure of the substrate 200 to the solution may be followed by a rinse step in de-ionized water. The removal step 104 may be performed in either a single substrate or batch system. The removal step 104 may be performed in an ultrasonically enhanced bath. Upon completion of start step 102 and oxide removal step 104, the substrate 200 is placed in a vacuum load lock or nitrogen ($N_2$) purged environment for transport on to the next processing chamber for plasma nitriding.

Figure 2A:
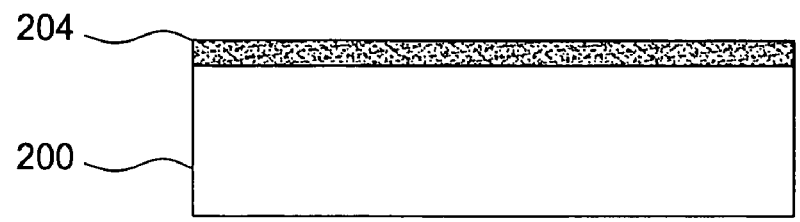
FIGS. 2A to 2D are schematic sectional views of a substrate illustrating process steps of one embodiment of the invention performed on the substrate.
Figure 2B:
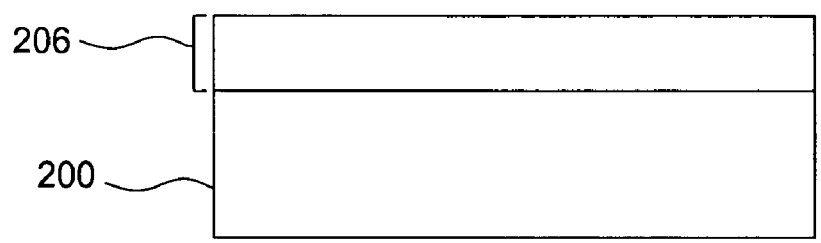

During the plasma nitridation step 106, substrate 200 is exposed to nitrogen-containing plasma. FIG. 2B illustrates a silicon nitride or oxynitride film layer 206 grown on the substrate 200 as a product of the plasma nitridation step 106. Generally, the layer 206 may have a thickness of about 2 to about 12 Å. In one embodiment, the layer 206 has a thickness of about 6 to about 10 Å. The chamber for the plasma nitridation step is a RADIANCE™ reactor or RTP XE+™ reactor. RADIANCE™ or RTP XE+™ reactors are available from Applied Materials of Santa Clara, Calif. In one embodiment, the plasma of step 106 contains nitrogen ($N_2$), as well as one or more optional inert gases such as argon (Ar) and helium (He). Step 106 can be performed using a decoupled plasma nitridation (DPN) plasma reactor of an integrated processing system. A sub-layer of nitrogen containing film 205 has a typical thickness of about 1 to about 12 Å, preferably about 3 to about 6 Å.

In one embodiment, the plasma contains nitrogen ($N_2$), as well as one or more oxidizing gas such as oxygen ($O_2$), nitric oxide (NO), and nitrous oxide ($N_2O$). The plasma may contain one or more optional inert gases such as argon (Ar) or helium (He). In an alternative embodiment, the plasma contains ammonia ($NH_3$), as well as one or more optional inert gases such as argon (Ar) or helium (He). In one embodiment, the layer 206 may be formed in a DPN reactor by providing nitrogen ($N_2$) at about 10 to about 2000 sccm, a substrate support temperature of about 20 to about 500° C., and a pressure in the reaction chamber of about 5 to about 1000 mTorr. The radio-frequency (RF) plasma is energized at 13.56 MHz using either a continuous wave (CW) or pulsed plasma power source of about 3 to about 5 kW. During pulsing, peak RF power, frequency, and a duty cycle are about 10 to about 3000 W, about 2 to about 100 kHz, and about 2 to about 50 percent, respectively. Pulsing may be performed for about 1 to about 180 seconds. In one embodiment, $N_2$ is provided at about 200 sccm and about 1000 W of peak RF power is pulsed at about 10 kHz with a duty cycle of about 5 percent applied to an inductive plasma source, at a temperature of about 25° C. and a pressure of about 40 to about 80 mTorr, for about 15 to about 60 seconds.

Figure 2C:
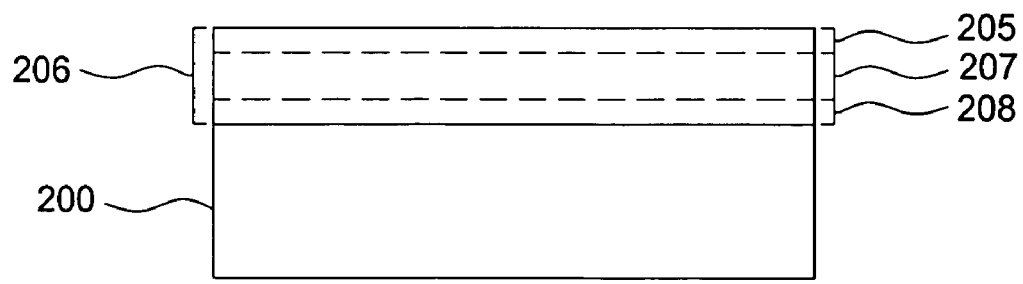

As is illustrated by FIG. 2C, plasma nitridation step 106 forms a silicon oxynitride layer 206 with sub layers 205, 207, and 208. The sub layers 205, 207, 208 vary in nitrogen, hydrogen, and oxygen concentration within the layer 206. The upper sublayer 205 has the highest nitrogen concentration of the three sublayers and sublayer 208 has the lowest concentration of nitrogen. This concentration gradient provides layer 206 with a more desirable interface between the substrate 200 (that contains minimal nitrogen) and the sublayer 208 with a lower nitrogen content than the rest of the layer 206.

Following plasma nitridation, thermal oxidation is performed on the substrate at step 108 using a thermal annealing chamber, such as a RADIANCE™ reactor or RTP XE+™ reactor. RADIANCE™ reactors and RTP XE+™ reactors are available from Applied Materials of Santa Clara, Calif. Thermal oxidation improves the chemical composition and chemical binding structure of the silicon oxynitride layer 206 by increasing the oxygen content of sublayers 205, 207, and 208, providing increased electron mobility in the dielectric sublayers. Step 108 also improves the crystalline structure and chemical composition of the interface between layer 206 and substrate 200 by tuning the oxygen and silicon concentration profiles at the interface. This improved crystalline structure and chemical composition at the interface improves the reliability of the interface.

In one embodiment, the thermal oxidation may be performed by providing about 2 to about 5000 sccm oxygen ($O_2$) or about 100 to about 5000 sccm nitric oxide (NO) or both gases at the same time and flow rates. The preferred process uses 500 sccm $O_2$. Either gas may be optionally mixed with nitrogen ($N_2$). The substrate surface temperature is about 800° C. to about 1100° C., and a pressure in the reaction chamber is about 0.1 to about 50 Torr. The process may be performed for about 5 to about 180 seconds. In one embodiment, $O_2$ is provided at about 500 sccm while maintaining the chamber at about 1000° C. and a pressure of about 0.1 Torr, for about 15 seconds. In another embodiment, NO is provided at about 500 sccm at a substrate temperature of about 1000° C. and a pressure of about 0.5 Torr for about 15 seconds.

In another embodiment, the thermal oxidation may be performed by providing a wet oxidation environment. This process, known as in situ steam generation (ISSG), is commercially available from Applied Materials, Inc. of Santa Clara, Calif. The ISSG process includes heating the substrate surface to about 700° C. to 1000° C. in an environment with 500 sccm to 5000 sccm oxygen and 10 sccm to 1000 sccm hydrogen, and at a pressure of 0.5 to 18.0 Torr. Preferably, hydrogen is less than 20 percent of the total gas flow of the mixture of oxygen and hydrogen. The period of exposure to the gas mixture is about 5 to about 180 seconds. In one embodiment, oxygen is provided at 980 sccm, hydrogen is provided at 20 sccm, the substrate surface temperature is 800° C., the chamber pressure is 7.5 Torr, and the period of exposure is about 15 seconds. The process can be performed in a RADIANCE™ reactor or an RTP XE™ reactor. RADIANCE™ reactors and RTP XE™ reactors are commercially available from Applied Materials, Inc. of Santa Clara, Calif.

Figure 2D:
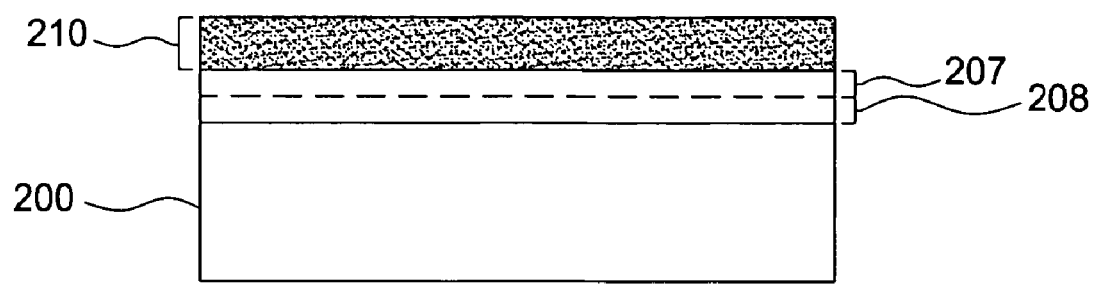

After thermal oxidation, the substrate is exposed to a hydrogen free nitrogen containing precursor during plasma nitridation step 110. The layer 206 is treated with nitrogen plasma to enhance the amount of nitrogen in the layer 206, especially to increase the nitrogen content of the upper sub layers 205 and 207 of FIG. 2C to form a nitrogen enhanced sub layer. FIG. 2D illustrates a nitrogen enhanced, hydrogen free sub layer 210 that forms on the top surface of the dielectric layer during plasma nitridation step 110. Hydrogen free nitrogen containing precursors for this plasma nitridation step 110 include nitrogen, nitrous oxide, and nitric oxide. The process may be performed using a DPN reactor by providing nitrogen ($N_2$) at about 10 to about 2000 sccm, a substrate support temperature of about 20° C. to about 500° C., and a reaction chamber pressure between about 5 to about 1000 mTorr. The radio-frequency (RF) plasma is at 13.56 MHz, with a continuous wave (CW) or pulsed plasma power source of about 3 to about 5 kW. During pulsing, peak RF power, frequency and duty cycle are typically about 10 to about 3000 W, about 2 to about 100 kHz, and about 2 to about 50 percent, respectively. Plasma nitridation may be performed for about 1 to about 180 seconds. In one embodiment, $N_2$ is provided at about 200 sccm, and about 1000 W RF power is pulsed at about 10 kHz with a duty cycle of about 5 percent applied to an inductive plasma source, at about 25° C. and about 100 to about 80 mTorr, for about 15 to about 180 sec. The plasma may be produced using a quasi-remote plasma source, an inductive plasma source, a radial line slotted antenna (RLSA) source, or other plasma sources. In alternate embodiments, sources of CW or pulsed microwave power may be used to form the layer 210.

After thermal oxidation step 108 and plasma nitration step 110, the nitrogen and oxygen concentration gradient in the sub layers 210, 207, and 208 illustrated by FIG. 2C progresses from sub layer 210 that is nitrogen rich and hydrogen free and thus has a higher dielectric constant than comparable oxynitride films to sub layer 208 that has been tailored to provide an improved interface between the dielectric and substrate 200. During thermal anneal step 112, the dielectric layers and substrate 200 are annealed. Thermal anneal step 112 improves reliability of the resulting gate dielectric by reducing leakage current in the layers 210, 207, and 208 and increasing the charge carrier mobility of the upper sub layers of substrate 200. Thermal anneal step 112 can be performed using an annealing chamber, such as the RADIANCE™ reactor or RTP XE+™ reactor of an integrated processing system available from Applied Materials of Santa Clara, Calif. Alternatively, the anneal step may not be performed.

In one embodiment, the annealing process is performed by providing about 2 to about 5000 sccm oxygen $O_2$ or about 100 to about 5000 sccm NO. Additionally, the two gases may be introduced to the chamber at the same time. The $O_2$ and/or NO is optionally mixed with $N_2$, while maintaining the substrate temperature of about 800° C. to about 1100° C. and about 0.1 to about 50.0 Torr in the chamber. The process may be performed for about 5 to about 180 seconds. In one embodiment, $O_2$ is provided at about 500 sccm, the substrate is heated to about 1000° C., the chamber pressure is about 0.1 Torr, and the time of exposure is about 15 seconds. In another embodiment, NO is provided at about 500 sccm, the substrate is heated to about 1000° C., the chamber pressure is about 0.5 Torr, and the time of exposure is about 15 seconds.

Upon completion of end step 114, process 100 is completed and the substrate is moved to an additional chamber or integrated tool for further processing during end step 114.

The absence of hydrogen in the final plasma nitridation and anneal steps yields a film with improved properties. The film has a higher dielectric constant than a silicon oxide film with a similar thickness. The effective oxide thickness (EOT) is about 7 to about 12 Å. The channel integrity and the negative bias temperature instability (NBTI) are improved. The concentration gradient formed in the film increases the dielectric constant while also providing an improved interface between the dielectric and substrate.

While the foregoing is directed to embodiments of the present invention, other and further embodiments of the invention may be devised without departing from the basic scope thereof, and the scope thereof is determined by the claims that follow.

The invention claimed is:
1. A method for the deposition of a dielectric film, comprising:
forming silicon nitride on a surface of a substrate within a reaction chamber;

oxidizing the silicon nitride on the surface of the substrate, wherein oxidizing the silicon nitride further comprises maintaining a substrate surface temperature of about 800° C. to about 1,100° C.;

exposing the oxidized silicon nitride on the surface of the substrate to a hydrogen-free nitrogen precursor in a plasma, wherein the substrate is heated to a temperature within a range from about 20° C. to about 500° C. during the exposing of the oxidized silicon nitride on the surface of the substrate to the hydrogen-free nitrogen precursor to enhance the amount of nitrogen in the oxidized silicon nitride on the surface of the substrate; and annealing the substrate.

* * * * *